United States Patent [19]

Nguyen et al.

[11] Patent Number: 5,172,197
[45] Date of Patent: Dec. 15, 1992

[54] HEMT STRUCTURE WITH PASSIVATED DONOR LAYER

[75] Inventors: Loi D. Nguyen, Agoura Hills; Michael J. Delaney, Thousand Oaks; Lawrence E. Larson, Santa Monica, all of Calif.; Umesh K. Mishra, Cary, N.C.

[73] Assignee: Hughes Aircraft Company, Los Angeles, Calif.

[21] Appl. No.: 812,875

[22] Filed: Dec. 20, 1991

Related U.S. Application Data

[63] Continuation of Ser. No. 7,507,945, Apr. 11, 1990, abandoned.

[51] Int. Cl.$^5$ .............................................. H01L 29/80
[52] U.S. Cl. ...................................... 357/22; 257/194; 257/283
[58] Field of Search .................. 357/22 I, 22 J, 22 K, 357/22 L, 22 R, 22 MD, 7, 22 S, 22 A, 16

[56] References Cited

U.S. PATENT DOCUMENTS

| | | | |
|---|---|---|---|
| 4,761,620 | 8/1988 | Bar-Joseph et al. | 357/22 L |
| 4,780,748 | 10/1988 | Cunningham et al. | 357/22 K |
| 4,862,228 | 8/1989 | Ralph | 357/22 A |
| 4,914,488 | 4/1990 | Yamane et al. | 357/22 L |

FOREIGN PATENT DOCUMENTS

| | | | |
|---|---|---|---|
| 5963770 | 4/1984 | Japan | 357/22 MD |
| 59-184570 | 10/1984 | Japan | 357/22 |
| 60263473 | 12/1985 | Japan | 357/22 MD |
| 61-139071 | 6/1986 | Japan | 357/22 |
| 6276565 | 4/1987 | Japan | 357/22 MD |
| 63-60566 | 3/1988 | Japan | 357/22 |
| 63-60570 | 3/1988 | Japan | 357/22 |
| 1-90566 | 3/1989 | Japan | 357/22 |
| 1-166573 | 6/1989 | Japan | 357/22 |
| 151309A | 8/1985 | United Kingdom | 357/22 MD |

OTHER PUBLICATIONS

A New Fabrication . . . Nonalloyed Ohmic Contacts IEEE vol. 36 No. 10 Oct. 1989.
Double Heterostructure GaInAs MESFETs by MBE IEEE vol. EDL-1 No. 8 Aug. 1980.
Modulation doped MBE GaAs/n-AlGaAs MESFET IEEE vol. EDL-2 No. 1 Jan. 1981.
"Ultra-High-Speed Digital Circuit Performance in 0.2 $\mu$m Gate-Length AlInAs/GaInAs HEMT Technology", U. Mishra et al., IEEE Electron Device Letters, vol. 9, No. 9, Sep. 1988, pp. 482–484.
"A New Low-Noise AlGaAs/GaAs 2 DEG FET with a Surface Undoped Layer", Hida et al., IEEE Transactions on Electron Devices, May, No. 5, vol. ED-33, pp. 601–607.
"A New GaAs Technology for Stable FET's at 300° C." by K. Fricke, et al. IEEE Electron Device Letters, vol. 10, No. 12, pp. 577–579 (Dec. 1989).

Primary Examiner—Andrew J. James
Assistant Examiner—Hung X. Dang
Attorney, Agent, or Firm—E. E. Leitereg; V. D. Duraiswamy; W. K. Denson-Low

[57] ABSTRACT

A channel layer, donor layer, Schottky layer, and cap layer are formed on a substrate. A source and drain are formed on the cap layer. A gate is formed on the cap layer, or at the bottom of a recess which is formed through the cap layer and partially extends into the Schottky layer. The donor and Schottky layers are formed of a semiconductive material which includes an oxidizable component such as aluminum. A passivation or stop layer of a lattice-matched, non-oxidizable material is formed underlying the source, drain, and gate, and sealingly overlying the donor layer. The stop layer may be formed between the Schottky layer and the donor layer, or constitute a superlattice in combination with the Schottky layer consisting of alternating stop and Schottky sublayers. Alternatively, the stop layer may sealingly overlie the Schottky layer, and further constitute the cap layer.

8 Claims, 2 Drawing Sheets

HEMT STRUCTURE WITH PASSIVATED DONOR LAYER

This is a continuation of application Ser. No. 07/507,945 filed Apr. 11, 1990 now abandoned.

BACKGROUND OF THE INVENTION

1. Field of the Invention

The present invention generally relates to the art of electronic transistors, and more specifically to a high electron mobility field-effect transistor structure having a passivated donor layer.

2. Description of the Related Art

A modulation-doped field-effect transistor (MODFET), otherwise known as a high electron mobility field-effect transistor (HEMT), is an extremely fast three-terminal electronic transistor device which has broad applications in millimeter wave systems, satellite receivers and transmitters, as well as advanced radar and fiber-optic systems. However, problems including device passivation have affected the reliability of HEMTs to such an adverse extent that widespread practical implementation has not been heretofore possible.

A conventional HEMT structure 10 illustrated in FIG. 1 includes a substrate 12, channel layer 14, spacer layer 16, donor layer 18, Schottky layer 20, and cap layer 22 formed on the substrate 12. A source 24 and drain 26 are formed on the cap layer 22. A gate 28 is formed on the bottom of a recess 30 which extends through the cap layer 22 and at least partially through the Schottky layer 20. The spacer, donor and Schottky layers 16, 18, 20 respectively are typically formed of a "wide" bandgap semiconductive material such as aluminum indium arsenide (AlInAs) or aluminum gallium arsenide (AlGaAs). The channel and cap layers 14 and 22 respectively are formed of a "narrow" bandgap material which is lattice-matched to the wide bandgap material, such as gallium arsenide (GaAs) or gallium indium arsenide (GaInAs). A major problem with the conventional structure is that the wide bandgap material which forms the donor and Schottky layers includes a component (aluminum in the above exemplary materials) which is prone to oxidation at low temperatures. The reference numeral 32 designates areas in which the Schottky layer 20 is exposed to the atmosphere and oxidized thereby. The oxidation spreads through the Schottky layer 20 into the donor layer 18, causing substantial reduction of the channel current.

Oxidation can be prevented by forming a passivation layer of dielectric silicon nitride or silicon oxide over the entire surface of the device, as described in an article entitled "A New GaAs Technology for Stable FET's at 300° C., by K. Fricke et al, in IEEE Electron Device Letters, vol. 10, no. 12, pp. 577–579 (Dec. 1989). The passivation layer hermetically seals the structure, preventing oxidation of the Schottky and donor layers. However, this compromises the performance of the device because of the extra capacitance created by the dielectric passivation layer. In addition, such passivation layers must be deposited at relatively high temperatures, which can degrade the performance of the device.

SUMMARY OF THE INVENTION

The present invention provides an improved field-effect transistor structure including at least one passivation or stop layer incorporated into the transistor, which prevents oxidation of a donor layer and resulting degradation of the performance and reliability of the device. The invention eliminates the necessity of forming a passivation layer over the entire surface of the device, and the requisite high temperature processing steps.

In a transistor structure embodying the present invention, a donor layer, Schottky layer, and cap layer are formed on a substrate. A source and drain are formed on the cap layer. A gate is formed on the cap layer, or at the bottom of a recess which is formed through the cap layer and partially extends into the Schottky layer. The donor and Schottky layers are formed of a semiconductive material which includes an oxidizable component such as aluminum. A passivation or stop layer of a lattice-matched, non-oxidizable material is formed underlying the source, drain, and gate, and sealingly overlying the donor layer. The stop layer may be formed between the Schottky layer and the donor layer, or constitute a superlattice in combination with the Schottky layer consisting of alternating stop and Schottky sublayers. Alternatively, the stop layer may sealingly overlie the Schottky layer, and further constitute the cap layer.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
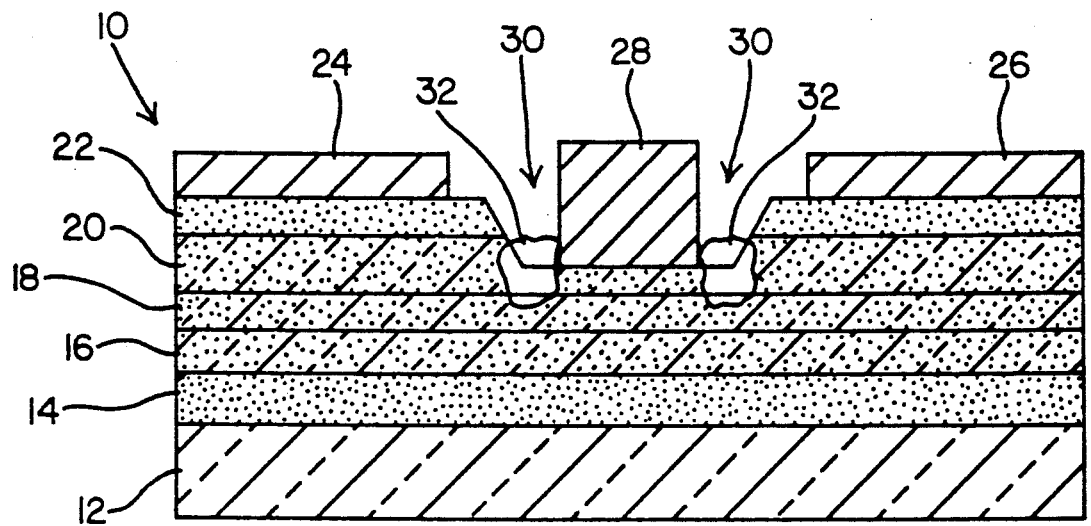
FIG. 1 is a simplified sectional view of a conventional HEMT structure, illustrating oxidation of Schottky and donor layers thereof.
Figure 2:
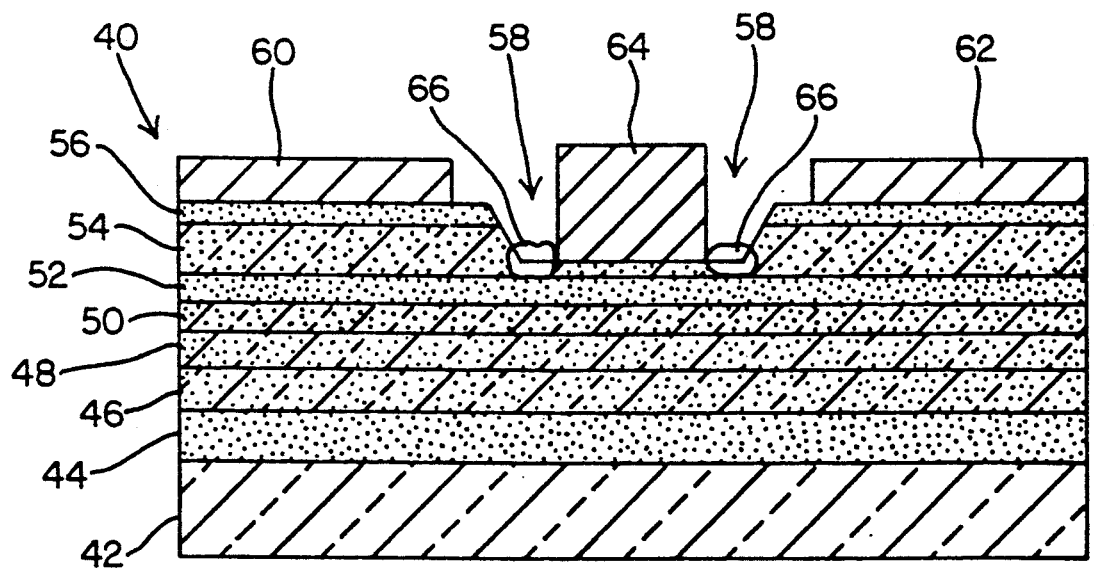
FIG. 2 is a simplified sectional view of a first embodiment of a passivated transistor structure embodying the present invention.

Referring now to FIG. 2 of the drawing, a HEMT structure embodying the present invention is generally designated as 40, and includes a substrate 42 formed of a suitable material such as GaAs, GaInAs, or InP, which may have a buffer layer (not shown) of, for example, AlInAs formed thereon. A channel layer 44, spacer layer 46, donor layer 48, Schottky layer 50, passivation or stop layer 52, Schottky layer 54, and cap layer 56 are formed on the substrate 42 such that each successive layer overlies the previous layers. A recess 58 is formed through the cap layer 56, and extends at least partially into the Schottky layer 54. A source 60 and drain 62 are formed on the cap layer 56 on opposite sides of the recess 58. A gate 64 is formed on the bottom of the recess 58.

The HEMT 40 operates in a conventional manner, with electrons propagating through the channel layer 44 between the source 60 and drain 62 in response to a voltage applied thereacross. The magnitude of electron flow is determined by a voltage applied to the gate 64.

The donor layer 48 and channel layer 44 form a heterojunction structure, with mobile electrons from the donor layer 48 being induced into the channel layer 44 due to a space charge effect between the layers 48 and 44 (which extends across the spacer layer 46). The absence of donor atoms in the channel layer 44 greatly increases the mobility of electrons therein. The Schottky layer 54 is provided to reduce the gate leakage current of the device.

The spacer layer 46, donor layer 48, and Schottky layers 50 and 54 are formed of a wide bandgap semiconductive material such as AlInAs or AlGaAs which includes an oxidizable component, in this case aluminum. The channel layer 44 and cap layer 56 are formed of a narrow bandgap material which does not include an oxidizable component, such as GaInAs or GaAs, and is lattice-matched to the wide bandgap material. In accordance with the present invention, the passivation or stop layer 52 is formed of a lattice-matched or pseudomorphic material, preferably the same narrow bandgap material which constitutes the channel and cap layers 44 and 56 respectively, and does not include an oxidizable component.

As indicated at 66 in FIG. 2, portions of the Schottky layer 54 on opposite sides of the gate 64 in the recess 58 are exposed to the atmosphere and may oxidize. However, the oxidation is prevented from spreading to the donor layer 48 by the overlying stop layer 52, which is formed of a non-oxidizable material. The addition of the stop layer 52 reduces the Schottky barrier height of the device to a small extent, but this is not a significant problem if the stop layer 52 is made sufficiently thin.

The Schottky layer 50 is optional, and may be omitted in accordance with a particular application. The embodiment of FIG. 2 is particularly advantageous for forming discrete devices in GaInAs in which the spacing between the gate 64 and channel layer 44 is the same for all devices on a wafer, and is determined by a common etching process step.

Typical values for the thicknesses of the component layers of the structure 40 are as follows. However, these values are exemplary, and not to be construed as limiting the scope of the invention.

Channel layer 44–400 angstroms; spacer layer 46–15 angstroms; donor layer 48 (doped with silicon)–50 to 80 angstroms; Schottky layer 50–20 to 40 angstroms; stop layer 52—as thin as possible, typically 5 to 15 angstroms; Schottky layer 54–150 to 200 angstroms; cap layer 56–50 to 75 angstroms. The thickness of the Schottky layer 54 in the recess 58 under the gate 64 may be approximately 20 to 60 angstroms.

Figure 3:
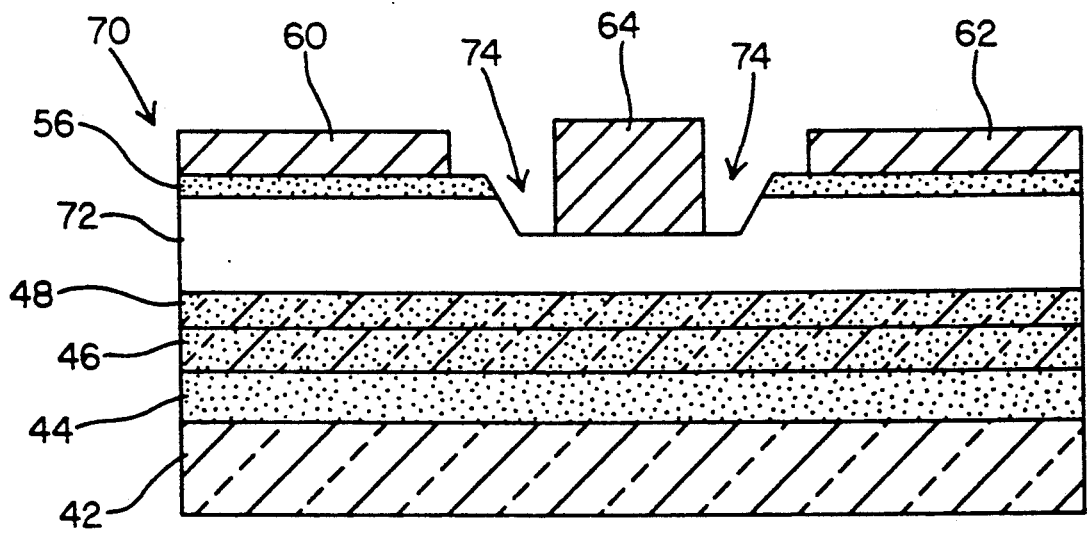
FIG. 3 is similar to FIG. 2 but illustrates a second embodiment of the invention.
Figure 4:
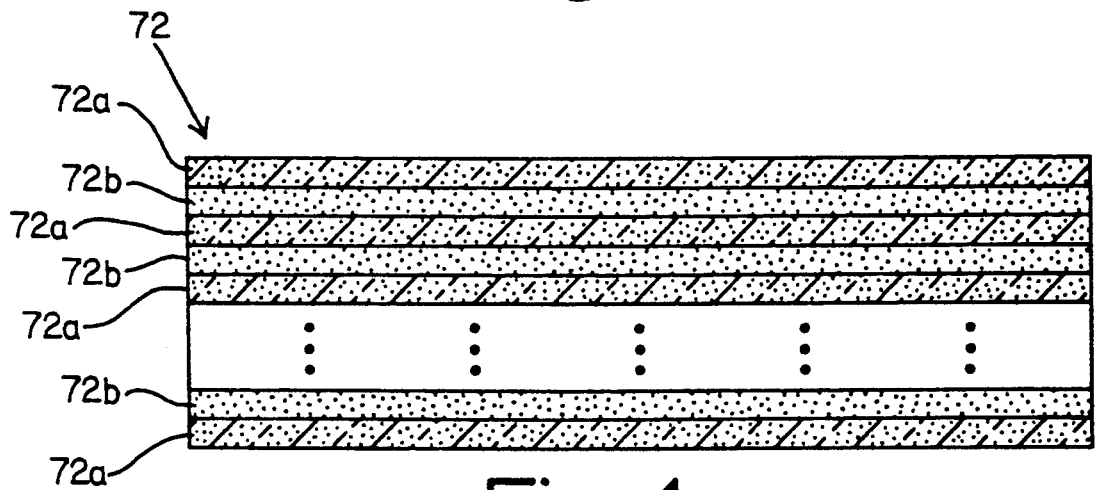
FIG. 4 is an enlarged sectional view illustrating a superlattice layer structure of the embodiment of FIG. 3.

FIGS. 3 and 4 illustrate another embodiment of the present invention, in which like elements are designated by the same reference numerals used in FIG. 2. In a transistor structure 70, the layers 50, 52, and 54 are replaced by a superlattice 72 which is shown to an enlarged scale in FIG. 4. More specifically, the superlattice 72 is formed of alternating Schottky and stop sublayers 72a and 72b respectively, the numbers of which are selected in accordance with the particular application. The superlattice 72 is equivalent to the Schottky layers 48 and 54 and the stop layer 52 of FIG. 2 taken in combination. A recess 74 may be etched into the superlattice 72 to a depth which provides the desired gate to channel spacing and Schottky barrier height. Although edges of the Schottky sublayers 72a which are exposed by etching of the recess 74 are subject to oxidation, the etching is controlled to such an extent that at least one stop sublayer 72b is left unetched to sealingly overlie the donor layer 48.

Typically, the thickness of the superlattice 72 will be 200 to 250 angstroms. The Schottky sublayers 72a will be on the order of 30 angstroms thick, with the stop sublayers 72b will being 10 angstroms thick. The superlattice period (number of alternating sublayers) will be 5 to 6.

The embodiment of FIGS. 3 and 4 is advantageous in that it enables adjustment of the gate to channel spacing on an individual device basis. It also reduces the need for precise control over the gate region etch, in applications where such precision is a particularly undesirable requirement. In the embodiment of FIG. 2, the etching must be stopped before it reaches the stop layer 52. If it did not, the oxidation could proceed through the underlying Schottky layer 50 (if provided) and donor layer 48. The embodiment of FIGS. 3 and 4 allows greater latitude in etching, since a slight over or underetch will still provide at least one stop sublayer 72b under the gate 64. The embodiment of FIGS. 3 and 4 is particularly suitable for forming dissimilar devices, having different gate to channel spacings, in a material such as AlGaAs, which has a higher Schottky barrier height and lower gate leakage current than GaInAs.

Figure 5:
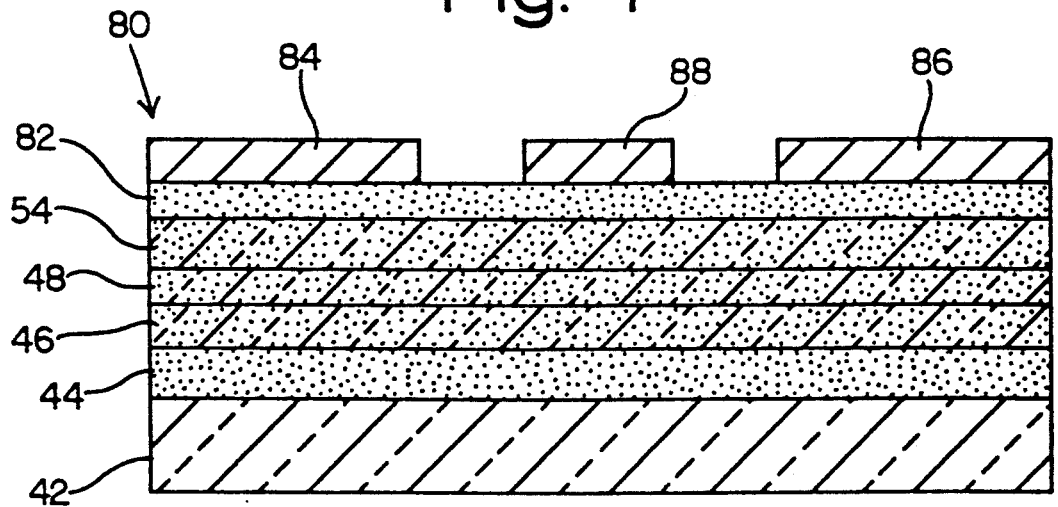
FIG. 5 is similar to FIG. 2, but illustrates a third embodiment of the present invention.

FIG. 5 illustrates another embodiment of the present invention, with like elements again designated by the same reference numerals. A transistor structure 80 includes a unitary cap layer 82 which further constitutes a stop layer. The source 84, drain 86, and gate 88 are formed on the cap layer 82. The structure 80 does not include a recess in which the gate 88 is formed, and is advantageous in that the etching steps required for forming a gate recess are eliminated. The cap layer 82 sealingly overlies the Schottky layer 54 and donor layer 48, preventing them from ever being exposed to an oxidizing atmosphere. The embodiment of FIG. 5 is suitable in applications where the cap layer 82 may be made thin enough to maintain an adequate Schottky barrier height for the gate 88, and where limited flexibility in selection of parameters such as the device pinchoff voltage is not a problem.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A field-effect transistor structure including a substrate; a channel layer formed of a narrow bandgap semiconductive material over said substrate; a donor layer formed of an oxidizable wide bandgap semiconductive material over said channel layer to form a heterojunction therewith; a source, drain, and gate which are ohmically separate from each other formed over said donor layer;

a single homogeneous oxidation-stop layer formed of a non-oxidizable narrow bandgap semiconductive material under said source, drain, and gate which is sealingly extending over said donor layer; and a first Schottky layer formed between said source, drain and gate and said stop layer, said Schottky layer being formed with a recess extending partially therethrough, wherein said gate is formed on a bottom surface of said recess.

2. A structure as in claim 1, further comprising a cap layer formed of said narrow bandgap semiconductive material between said source and drain; and said Schottky layer laterally external of said recess.

3. A structure as in claim 1, further comprising a second Schottky layer formed of said wide bandgap semiconductive material between said stop layer and said donor layer.

4. A structure as in claim 1, in which said wide bandgap semiconductive material is AlInAs, and said narrow bandgap semiconductive material is GaInAs.

5. A structure as in claim 1, in which said wide bandgap semiconductive material is AlGaAs, and said narrow bandgap semiconductive material is GaInAs.

6. A structure as in claim 1, in which said wide and narrow bandgap semiconductive materials are lattice-matched to each other.

7. An active transistor structure including a substrate; a first layer formed of an oxidizable wide bandgap semiconductive material over said substrate; a source drain, and gate which are ohmically separate from each other formed over said first layer;
a single homogeneous oxidation-stop layer formed of a non-oxidizable narrow bandgap material under said source, drain, and gate which is sealingly extending over said first layer;
a second layer formed of said oxidizable wide bandgap semiconductive material between said source, drain, and gate and said stop layer, said second layer being formed with a recess extending partially therethrough, wherein said gate is formed on the bottom of said recess.

8. A structure as in claim 7, further comprising a cap layer formed of said narrow bandgap non-oxidizable material between said source and drain; and said second layer laterally external of said recess.

* * * * *